United States Patent [19]
Gardner et al.

[11] Patent Number: 6,078,078
[45] Date of Patent: Jun. 20, 2000

[54] V-GATE TRANSISTOR

[75] Inventors: Mark I. Gardner, Cedar Creek; H. Jim Fulford; Charles E. May, both of Austin, all of Tex.

[73] Assignee: Advanced Micro Devices, Inc., Sunnyvale, Calif.

[21] Appl. No.: 09/164,929

[22] Filed: Oct. 1, 1998

[51] Int. Cl.[7] .............................. H01L 29/94; H01L 29/08
[52] U.S. Cl. .................. 257/330; 257/333; 257/401; 257/327; 257/389
[58] Field of Search ................................ 257/330, 333, 257/401, 327, 389

[56] References Cited

U.S. PATENT DOCUMENTS

| | | | |
|---|---|---|---|
| 4,295,924 | 10/1981 | Garnache et al. | 257/330 |
| 4,335,450 | 6/1982 | Thomas | 257/330 |
| 5,523,600 | 6/1996 | Kapoor | 257/330 |
| 5,808,340 | 9/1998 | Wollesen et al. | 257/330 |
| 5,905,283 | 5/1999 | Kasai | 257/334 |

FOREIGN PATENT DOCUMENTS

| | | | |
|---|---|---|---|
| 2-23670 | 1/1990 | Japan | 257/333 |
| 2-110973 | 4/1990 | Japan | |

OTHER PUBLICATIONS

Stanley Wolf and Richard N. Tauber; *Silicon Processing for the VLSI Era, vol. 1—Process Technology*; pp. 531–532; 1986.

Stanley Wolf and Richard N. Tauber; *Silicon Processing for the VLSI Era, vol. 3—The Submicron MOSFET*; pp. 274–294, 307–308 and 623–633; 1995.

*Primary Examiner*—John Guay
*Attorney, Agent, or Firm*—Timothy M. Honeycutt

[57] ABSTRACT

An integrated circuit and a method of making a transistor thereof are provided. The integrated circuit includes a substrate and a plurality of transistors positioned on a plurality of active areas. Each of the transistors has a gate dielectric layer with a V-shaped cross-section positioned on one of the plurality of active areas, a gate electrode positioned on the gate dielectric layer, a first source/drain region positioned in the substrate, and a second source/drain region positioned in the substrate in spaced-apart relation to the first source/drain region to define a channel region beneath the gate dielectric layer. The V-shaped gate dielectric layer requires less horizontal substrate area, enabling higher packing density for a given substrate.

13 Claims, 4 Drawing Sheets

V-GATE TRANSISTOR

BACKGROUND OF THE INVENTION

1. Field of the Invention

This invention relates generally to semiconductor processing, and more particularly to a transistor incorporating a V-shaped gate, and to a method of making the same.

2. Description of the Related Art

Scaling of field effect transistor devices has historically been, and continues to be a fundamental goal in the semiconductor fabrication industry. The continual drive toward higher circuit density has been fueled by demands from ordinary consumers, industry, government and the military for ever increasing speed, capability and miniaturization of electronic products, as well as the desire of semiconductor manufacturers to reduce manufacturing costs. Scaling efforts have thus far been highly successful. Three micron processing, considered state of the art a little more than a decade ago, has given way to sub-micron processing.

As in many aspects of semiconductor processing, current scaling efforts involve a set of trade-offs between higher packing density and better performance, and short channel effects. As process technology scaled below about 2.0 µm, a series of design difficulties arose stemming from the semiconductor physics associated with short-channel devices. Hot carrier effects and subthreshold leakage currents become much more problematic in short channel devices, such as modern field effect transistors in sub-2.0 µm processing. If not compensated for through processing techniques or other means, such effects can either reduce device performance or lead to device failure or both.

One method commonly used to alleviate short-channel effects in field effect transistors is the incorporation of lightly-doped drain ("LDD") structures. The purpose of LDD structures is to absorb some of the gate-to-substrate potential into the drain of the transistor. As with many aspects of semiconductor processing, there are tradeoffs associated with the incorporation of LDD structures. LDD structures will render PMOS devices more resistance to hot carrier injection, but will also generally reduce the drive current due to a rise in the series resistance of the drain region. In addition, the formation of LDD increases fabrication complexity. At least two, and more often four separate masking steps are required for CMOS circuits. Aside from increased processing complexity, LDD structures represent a constraint on the packing density of transistors. Conventional LDD and source/drain structures extend laterally to either side of a gate electrode. Accordingly, substrate area must be set aside to accommodate for these laterally extending structures. This set aside of chip area must always be taken into account even if improvements in lithographic patterning reduce the minimum lateral feature size of devices on the substrate.

Another technique to combat short channel effects has involved the scaling of gate dielectrics. To compensate for the potentially lower drive currents for a given short channel device, conventional silicon dioxide gate oxide layers are made as thin as possible to maximize drive current. However, the scaling of silicon dioxide gate dielectric layers has introduced another set of problems. To begin with, very thin silicon dioxide layers have been historically difficult to fabricate with a consistent thickness across a given wafer, from wafer to wafer and from lot to lot. In addition, as the thickness of silicon dioxide is scaled downward, the potential for reliability problems associated with dielectric breakdown and hot and cold carrier injection degradation increases. Hot and cold carrier degradation can significantly reduce device performance, while dielectric breakdown can lead to complete device failure.

One potential cause of carrier injection and potential dielectric breakdown is thought to occur as a result of interface traps near the Si—SiO, interface. Interface traps are the apparent result of dangling silicon bonds at the Si—SiO$_2$ interface. Dangling Si bonds represent sites where hot carrier injection, Fowler-Nordheim tunneling and direct tunneling can occur. Although tunneling is thought to arise as a natural consequence of the quantum mechanical nature of electrons positioned near a very thin oxide layer, dangling Si bonds appear to exacerbate the problem. Independent of the exact physical cause of carrier injection, the empirical result for very thin oxides may be gate leakage currents and/or catastrophic device failure.

Another difficulty associated with very thin conventional gate oxides is polysilicon depletion. In p-channel transistors, the source and drain are commonly formed in the substrate by implanting a p-type dopant, such as boron. The implant also deposits boron into the polysilicon of the gate electrode. Subsequent thermal processing steps to fabricate a conventional p-channel field effect transistor frequently cause boron to diffuse from the gate electrode through the gate oxide layer and into the channel region. If the amount of boron diffused is sufficiently high, the electrical performance of the field effect transistor may be severely degraded due to polysilicon depletion. The potential for boron diffusion increases with decreasing oxide thickness.

The present invention is directed to overcoming or reducing the effects of one or more of the foregoing disadvantages.

SUMMARY OF THE INVENTION

In accordance with one aspect of the present invention, a transistor is provided that includes a substrate that has an active area with a channel therein that has a substantially flat bottom and upwardly sloping walls. A gate dielectric layer is positioned in the channel. The gate dielectric layer has a bottom portion that has a first thickness, a first leg projecting obliquely upwardly from the bottom portion that has a second thickness, and a second leg projecting obliquely upwardly from the bottom portion that has a third thickness. The second and third thicknesses are larger than the first thickness. The bottom portion and the first and second legs define a V-shaped cross-section. A gate electrode is positioned on the gate dielectric layer. A first source/drain region is positioned in the substrate and a second source/drain region is positioned in the substrate in spaced-apart relation to the first source/drain region to define a channel region beneath the gate dielectric layer.

In accordance with another aspect of the present invention, an integrated circuit is provided that includes a substrate that has a plurality of active areas. Each of the active areas has a channel with a substantially flat bottom and upwardly sloping walls. A plurality of transistors are positioned on the plurality of active areas. Each of the transistors has a gate dielectric layer positioned in one of the plurality of channels with a bottom portion that has a first thickness, a first leg projecting obliquely upwardly from the bottom portion and that has a second thickness, and a second leg projecting obliquely upwardly from the bottom portion that has a third thickness. The second and third thicknesses are larger than the first thickness. The bottom portion and the first and second legs define a V-shaped cross-section. A gate electrode is positioned on the gate dielectric layer. A first source/drain region is positioned in the substrate, and a second source/drain region is positioned in the substrate in spaced-apart relation to the first source/drain region to define a channel region beneath the gate dielectric layer.

In accordance with another aspect of the present invention, a transistor is provided that includes a substrate that has an active area and a channel in the active area that has a substantially flat bottom and upwardly sloping walls. A portion of the active area is positioned above an isolation structure such that opposite sidewalls of the active area are exposed. A gate dielectric layer is positioned in the channel and has a V-shaped cross-section. A gate electrode is positioned on the gate dielectric layer. A first source/drain region positioned in the active area adjacent the one of the sidewalls and a second source/drain region positioned in the active area adjacent to the other of the sidewalls and in spaced-apart relation to the first source/drain region to define a channel region beneath the gate dielectric layer.

In accordance with another aspect of the present invention, a method of fabricating a transistor on an active area of a substrate is provided that includes the steps of forming a V-shaped channel in the active area with sloped sidewalls and forming a gate dielectric layer in the channel. A gate electrode is formed on the gate dielectric layer. A first source/drain region is formed in the substrate and a second source/drain region is formed in the substrate in spaced-apart relation to the first source/drain region to define a channel region beneath the gate dielectric layer.

BRIEF DESCRIPTION OF THE DRAWINGS

The foregoing and other advantages of the invention will become apparent upon reading the following detailed description and upon reference to the drawings in which: with the present invention.

DETAILED DESCRIPTION OF SPECIFIC EMBODIMENTS

Figure 1:
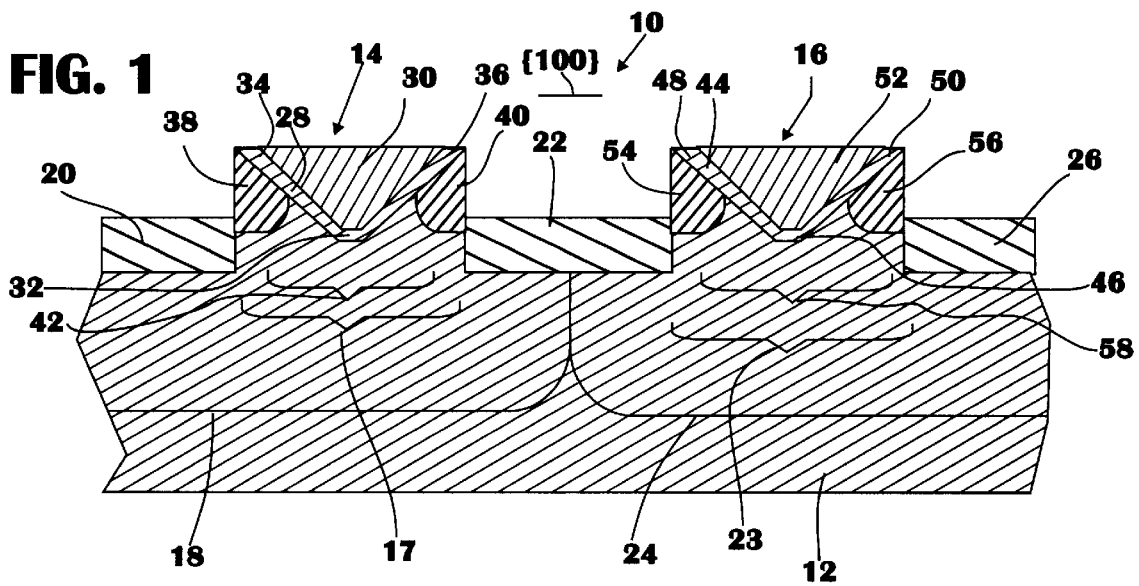
FIG. 1 is a cross-sectional view of an exemplary embodiment of an integrated circuit transistor including first and second transistors in accordance with the present invention.

In the drawings described below, reference numerals are generally repeated where identical elements appear in more than one figure. Turning now to the drawings, and in particular to FIG. 1, there is shown a cross-sectional view of an exemplary embodiment of an integrated circuit 10 formed on a semiconductor substrate 12. The semiconductor substrate 12 may be composed of n-doped, or p-doped silicon, silicon-on-insulator, or other suitable substrate materials. In an exemplary embodiment, the substrate 12 is composed of p-doped {100} monocrystalline silicon with a horizontal or {100}-plane of the substrate indicated. The integrated circuit 10 includes a plurality of transistors, two of which are shown and designated 14 and 16. The transistors 14 and 16 may be n-channel, p-channel or other types of devices. The transistor 14 is formed on an active area 17 of the substrate 12 that is positioned over a well 18 formed in the substrate 12. The lateral boundaries of the active area 17 are delineated, and the transistor 14 is electrically isolated from the transistor 16 and from other structures in the substrate 12, by isolation structures 20 and 22. The transistor 16 is similarly formed on an active area 23 of the substrate 12 that is positioned over a well 24 formed in the substrate 12. The lateral boundaries of the active area 23 are delineated, and the transistor 16 is electrically isolated from the transistor 14 and from other structures in the substrate 12, by isolation structures 22 and 26.

The transistor 14 includes a gate dielectric layer 28 formed on the substrate 12 and a gate electrode 30 formed on the gate dielectric layer 28. As used herein, the terms "formed on" or "positioned on" should be construed to include the possibility that a given layer may be formed on another given layer with a third or other intervening layers disposed between the two. The gate dielectric layer 28 is fabricated with a V-shaped cross-section that defines an apex 32 and legs 34 and 36 projecting obliquely upwardly therefrom. The transistor 14 is provided with source/drain regions 38 and 40 in the substrate 12 that are laterally separated to define a channel region 42 beneath the gate dielectric layer 26. The phrase "source/drain region(s)" is used herein to describe a region that may serve as either a source or a drain. The skilled artisan will appreciate that a source/drain region may function as a source or a drain depending upon how it is interconnected with subsequent metallization.

The transistor 16 is similarly provided with a gate dielectric layer 44 that includes an apex 46 and legs 48 and 50 projecting obliquely upwardly therefrom. A gate electrode 52 is positioned on the gate dielectric layer 44. Source/drain regions 54 and 56 are formed in the substrate 12 in spaced-apart relation to define a channel region 58 for the transistor 16.

Figure 2:
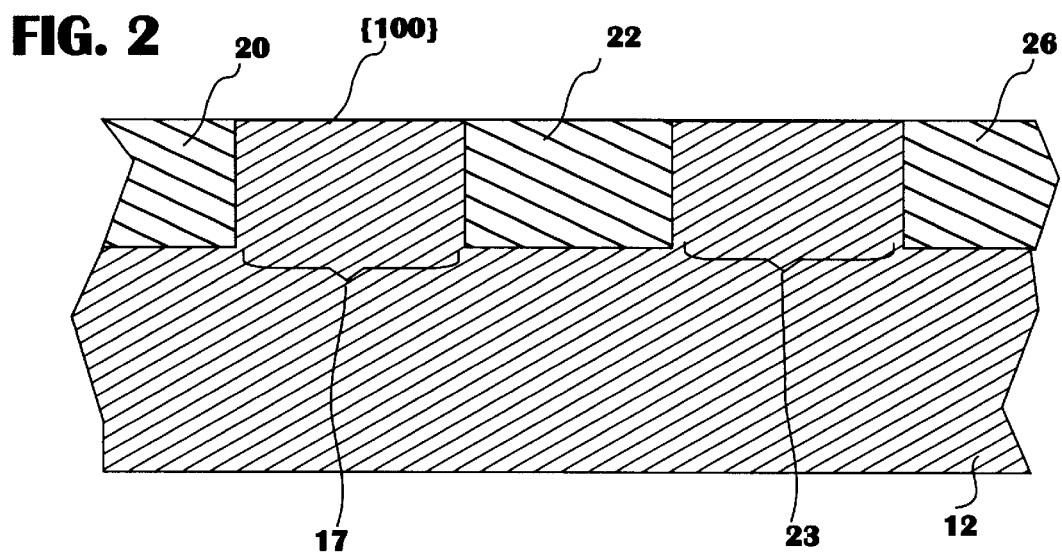
FIG. 2 is a cross-sectional view of a semiconductor substrate depicting initial definition of active areas and isolation structures in accordance with the present invention.
Figure 3:
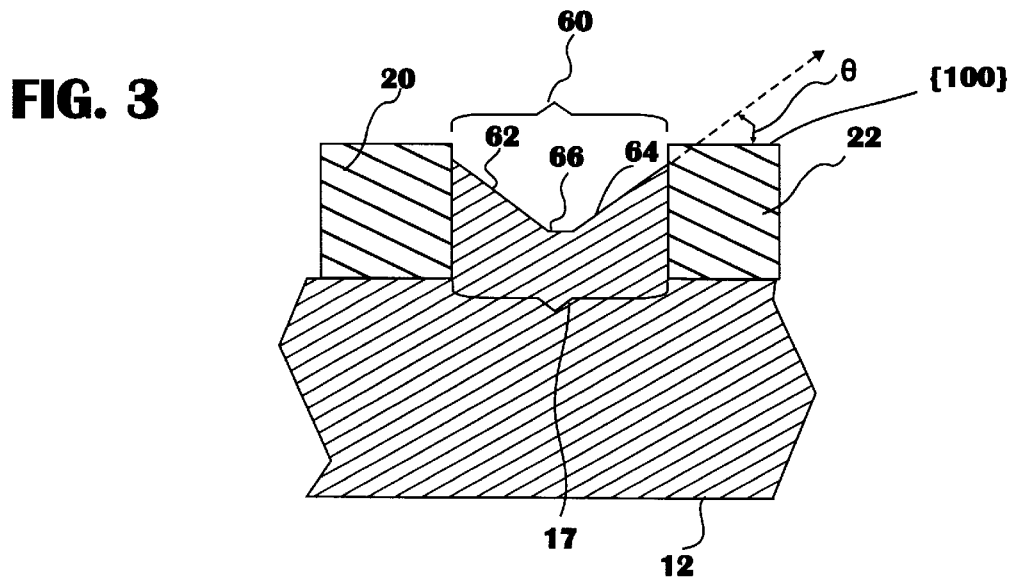
FIG. 3 is a cross-sectional view like FIG. 2 depicting formation of a V-shaped channel in one of the active areas in accordance with the present invention.

An exemplary process flow for forming the transistors 14 and 16 depicted in FIG. 1 may be understood by referring now to FIGS. 2–9, and initially to FIG. 2. For simplicity of illustration, the process flow described herein will focus on the fabrication of the transistor 14 implemented as an n-channel device. However, the skilled artisan will appreciate that the process to be described applies equally to the transistor 16. Turning now to FIG. 2, the isolation structures 20, 22 and 26 are established in the substrate 12. The structures 20, 22 and 26 may be shallow trench isolation, field oxide, or other isolation structures. In an exemplary embodiment, the structures 20, 22 and 26 are shallow trench isolation structures planarized to the upper surface of the substrate 12 as represented by the {100}-plane, and may be composed of silicon dioxide, tetra-ethyl-ortho-silicate ("TEOS") or other suitable isolation materials and may be formed using well known damascene etching and fill techniques. The structures may have a thickness of about 2000 to 3000 Å. The establishment of the isolation structures 20, 22 and 26 delineates the active area 17 and 23 of the substrate 12. The isolation structures 20, 22 and 26 are described herein as individual structures for ease of illustration. However, the skilled artisan will appreciate that the structures 20, 22 and 26 may be individual structures or constitute portions of a moat-like isolation structure surrounding the active area 17 and 23. Referring now to FIG. 3, a V-shaped channel 60 is formed in the active area 17 as shown. The V-shaped channel 60 includes sloped sidewalls 62 and 64 that join to a generally flat channel bottom 66. The slope of the sidewalls 62 and 64 is given by the angle θ, which is the angle between a given sidewall, 62 or 64, and the {100} plane of the substrate 12. The magnitude of the angle θ will depend upon the process used to form the channel 60 as described more fully below.

The channel 60 is advantageously formed by wet directional etching, or by dry directional etching with or without plasma or reactive ion enhancement. In an exemplary embodiment of the process of the present invention, the channel 60 is advantageously fabricated using a reactive ion directional dry etch process utilizing a mixture of one or more etchant species and one or more diluting species. In this exemplary embodiment, the etch ambient consists of an initial mixture of about 90 wt % $SF_6$ and about 10 wt % He. This initial mixture etches with a relatively high degree of anisotropicity. However, the concentration of $SF_6$ is decreased to about 10 wt % and the concentration of He increased to about 90 wt % over a time interval, T, to yield the sloped sidewalls 62 and 64 with a slope angle θ of about 45°. The value of the time interval T is a function of the desired depth of the channel 60. In this illustration, the etch is carried out with an interval T of about 80 seconds to yield a channel 60 with a depth of about 600 to 900 Å. In order to establish relatively uniformly sloped sidewalls 62 and 64, the time interval T is subdivided into several equal sub-intervals, $t_0, t_1 \ldots t_8$, and the concentrations of the etchant constituents are changed at the end of each sub-interval. The following table summarizes the variations in concentrations relative to time:

| Time (s) | $SF_6$ Concentration (wt %) | He Concentration (wt %) |
| --- | --- | --- |
| $t_0 = 0$ | 90 | 10 |
| $t_1 = 10$ | 80 | 20 |
| $t_2 = 20$ | 70 | 30 |
| $t_3 = 30$ | 60 | 40 |
| $t_4 = 40$ | 50 | 50 |
| $t_5 = 50$ | 40 | 60 |
| $t_6 = 60$ | 30 | 70 |
| $t_7 = 70$ | 20 | 80 |
| $t_8 = 80$ | 10 | 90 |

The total interval, T, as well as the number of sub-intervals are largely a matter of design discretion. However, the smoothness of the sidewalls 62 and 64 will generally increase if the number of sub-intervals is increased.

If more highly sloped sidewalls 62 and 64 are desired, the concentration of the diluting species, in this case He, is not ramped as high during the etch. For example, the He concentration may be increased from an initial value of about 10 wt % to only about 30 wt % during the interval T to yield a slope angle θ of about 75°. Conversely, if a more shallow slope is desired, the He concentration is started higher, at about 30 wt % for example, and then ramped higher over the time interval T to yield a slope angle θ of about 25°. In this way, the slope angle θ may be easily tailored between about 10° and about 80° as desired.

The etch yields the channel 60 with the substantially flat channel bottom 66. As described more fully below in conjunction with the description of the formation of the gate dielectric layer 28 (see FIG. 1) the substantially flat channel bottom 66 aids in the formation of the gate dielectric layer 28 with a smaller thickness in the vicinity of the channel bottom 66 and relatively larger thicknesses adjacent to the sidewalls 62 and 64.

Alternatively, the channel 60 may be formed using a wet etch with an etchant that exhibits orientation-dependent etching properties. In this regard, the substrate 12 may be etched using a mixture of about 24 wt % KOH, about 13 wt % isopropyl alcohol and about 63 wt % $H_2O$. This etchant mixture exhibits a much higher etch rate along {100}-planes than along {111}-planes and yields a V-shaped groove with an angle θ approximately equal to 54.7°. The 54.7° angle results from the sidewalls 62 and 64 being themselves {111}-planes. As with the aforementioned dry etch process, the substrate 12 is exposed to the wet etchant solution until the channel 60 is formed with a substantially flat channel bottom 66.

Figure 4:
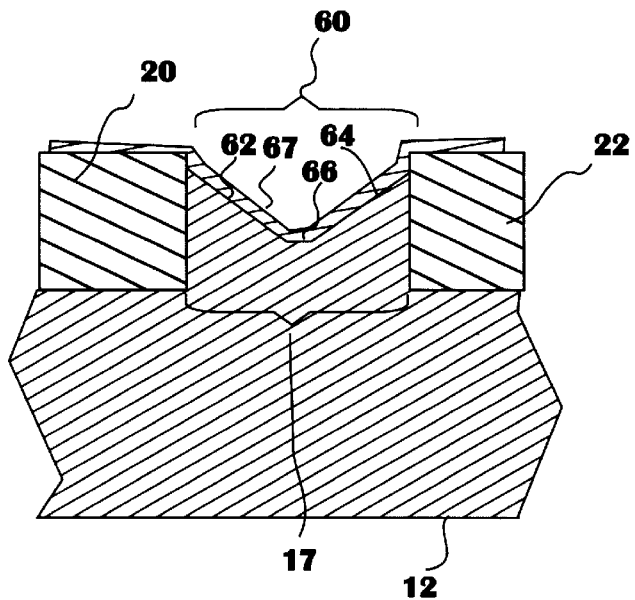
FIG. 4 is a cross-sectional view like FIG. 3 depicting formation of a screen oxide layer and various substrate conditioning implants in accordance with the present invention.

As shown in FIG. 4, a screen oxide layer 67 is formed over the substrate 12 in the channel 60. The screen oxide 67 may be established by chemical vapor deposition ("CVD") or thermal oxidation as desired. In an exemplary embodiment, the screen oxide layer 67 is established by thermal oxidation to a thickness of about 50 to 200 Å by dry oxidation in an oxygen containing ambient for about 30 to 60 seconds at about 750 to 1000° C. The wells 18 and 24 are established in the substrate 12 by ion implantation or diffusion as desired. The wells 18 and 24 may be twin, twin retrograde, or similar suitable wells, and are formed in the substrate 12 by using well known techniques involving the alternative masking and ion implantation of the regions between the isolation trenches 20 and 22 and 22 and 26 using dopants of opposite conductivity type for each well. Following the implants, the substrate 12 is annealed to drive the for the well implants and the anneal process will depend on wells 18 and 24 to the desired depth. The skilled artisan will appreciate that the parameters the initial doping level of the substrate, and the design rules for the fabrication process used. In exemplary embodiment, the wells 18 and 24 are established by implanting a p-type dopant, such as boron, with an energy and dosage of about 50 to 300 keV and about 4E12 to 9E12 $cm^{-2}$.

Threshold voltage control punchthrough implants may also be performed through the screen oxide 67. The threshold voltage control and punchthrough prevention implants may be performed using a p-type dopant, such as boron. The threshold voltage implant may be performed with a dosage of about 2E12 to 8E12 $cm^{-2}$ and an energy of about 2 to 20 keV. The punchthrough implant may be performed with a dosage of about 4E12 to 9E12 $cm^{-2}$ and an energy of about 30 to 150 keV. Following the implants, the screen oxide layer 67 is removed by wet or dry etching, selective to the underlying silicon substrate 12. For example, a diluted HF dip may be used.

Figure 5:
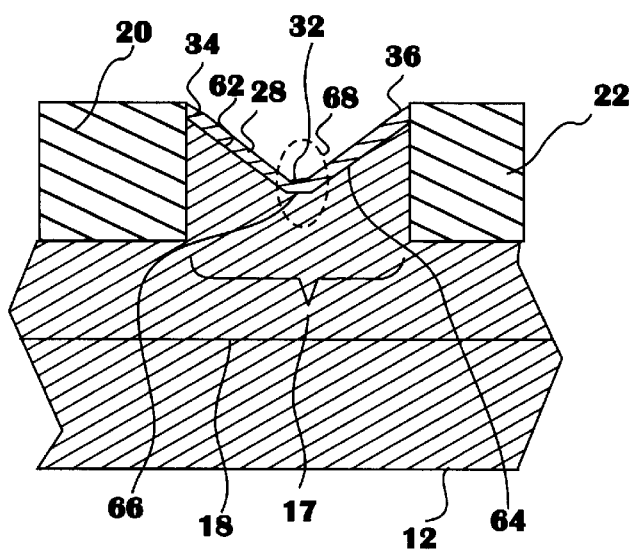
FIG. 5 is a cross-sectional view like FIG. 4 depicting formation of a gate dielectric layer with a V-shaped cross-section in accordance with the present invention.
Figure 6:
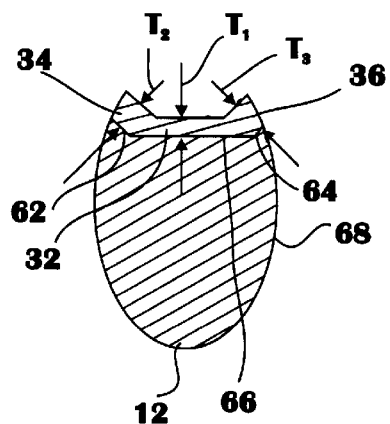
FIG. 6 is a highly magnified cross-sectional view of a designated portion of FIG. 5 in accordance with the present invention.

The fabrication of the gate dielectric layer 28 may be understood by referring now to FIGS. 5 and 6. FIG. 6 is a highly magnified view of the portion of FIG. 5 circumscribed by the dashed oval 68. The gate dielectric layer 28 may be composed of a variety of suitable gate dielectric materials, such as silicon dioxide, $Ta_2O_5$, silicon nitride, or the like, and may be formed using CVD, thermal oxidation or the like. In an exemplary embodiment, the gate dielectric layer 28 is composed of silicon dioxide formed by thermal oxidation by exposing the channel 62 to an oxygen containing ambient at about 750 to 1000° C. for about 5 to 20 seconds in rapid thermal anneal ("RTA") or via a furnace process for about 2 to 10 minutes at about 750 to 950° C. A furnace process will yield a slightly thicker gate dielectric layer 28.

As a result of the sloped sidewalls 62 and 64 of the channel 60 and the double-diamond lattice structure of the silicon substrate 12, the oxidation rate of the silicon lining the channel 60 will be orientation-dependent. As the atomic density of the substrate 12 is lower in the {100}-planes than in planes normal or oblique to the {100}-planes, the oxidation rate of the channel bottom 66 will be lower than the oxidation rate of the sidewalls 62 and 64. The differential oxidation rates result in the formation of the legs 36 and 34 of the gate dielectric layer 28 with respective thicknesses $T_2$ and $T_3$ that are appreciably larger than the thickness T, of the apex 32. The thicknesses $T_2$ and $T_3$ will usually be about the same, but may vary slightly due to surface nonuniformities in the channel sidewalls 62 and 64 and variations in the oxidation process. In an exemplary embodiment, the gate dielectric layer 28 may have a thickness of about 10 to 15 Å at the apex 32 and about 15 to 25 Å for the legs 34 and 36. Thus, the layer 28 is formed with a thin apex 32 that can yield potentially high, and thus desirable gate-to-substrate capacitances, a with relatively thicker legs 34 and 36 that protect the gate electrode 30 from hot-carriers and provide acceptably low levels of gate-to-source/drain overlap capacitances.

A nitrogen bearing species may be incorporated into the thermal oxidation step to form the gate dielectric layer 28 to strengthen the gate dielectric layer 28 against hot carrier injection. The exemplary nitrogen bearing species may be, for example, NO, $N_2O$, $NH_3$, or the like, or mixtures thereof.

Figure 7:
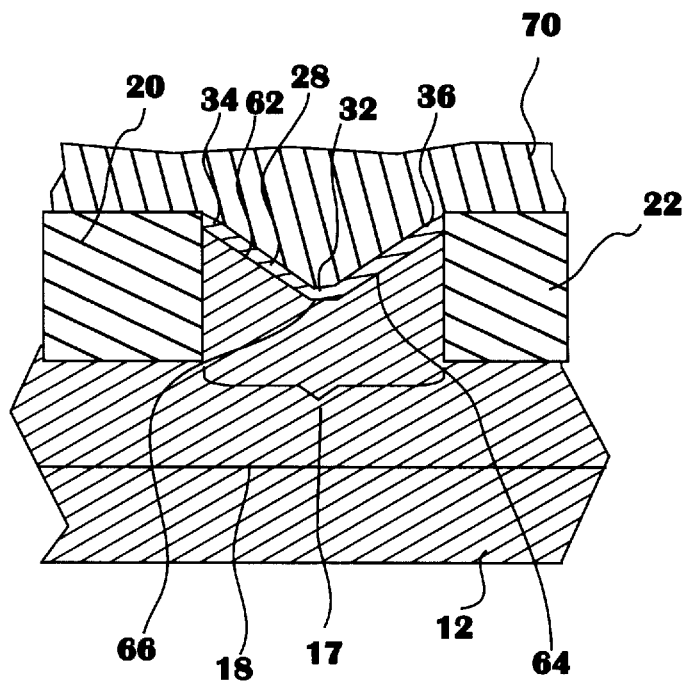
FIG. 7 is a cross-sectional view like FIG. 5 depicting deposition of a conductor layer on the gate dielectric layer in accordance with the present invention.
Figure 8:
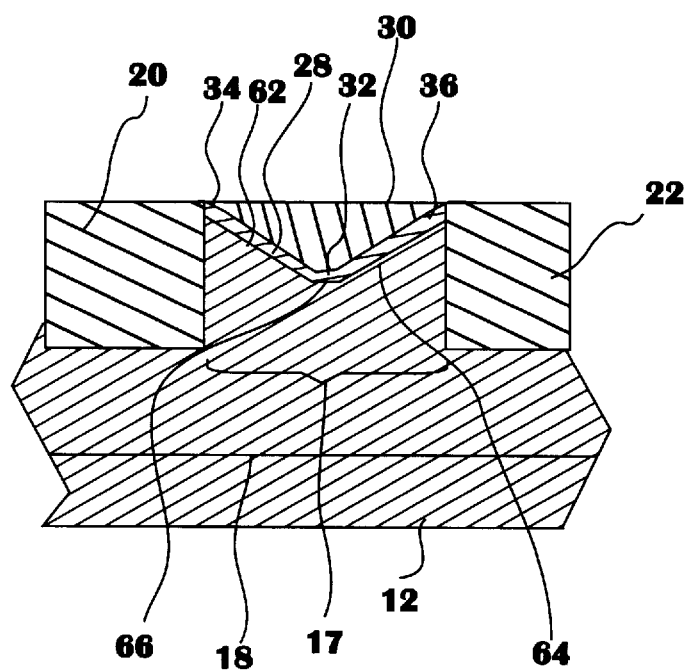
FIG. 8 is a cross-sectional view like FIG. 7 depicting planarization of the conductor layer to define a gate electrode for the one of the transistors in accordance with the present invention.

The fabrication of the gate electrode 30 may be understood by referring now to FIGS. 7 and 8. As shown in FIG. 7, a layer 70 of conducting material is blanket deposited over the gate dielectric layer 28 and is subsequently planarized to the isolation structures 20 and 22 as shown in FIG. 8 to yield the completed gate electrode 30. A variety of conducting materials may be used for the conducting layer 70 such as tungsten, tantalum, aluminum, titanium, polysilicon with subsequent doping, or the like. In an exemplary embodiment, the conductor layer 70 is composed of polysilicon and may be deposited by CVD. The planarization of the conductor layer 70 to yield the gate electrode 30 may be by etch back planarization, chemical mechanical polishing ("CMP") or the like, and is advantageously done via CMP. The gate electrode 30 conforms to the shape of the gate dielectric layer 28 and the channel 60, and thus presents a generally inverted triangular cross-section.

Figure 9:
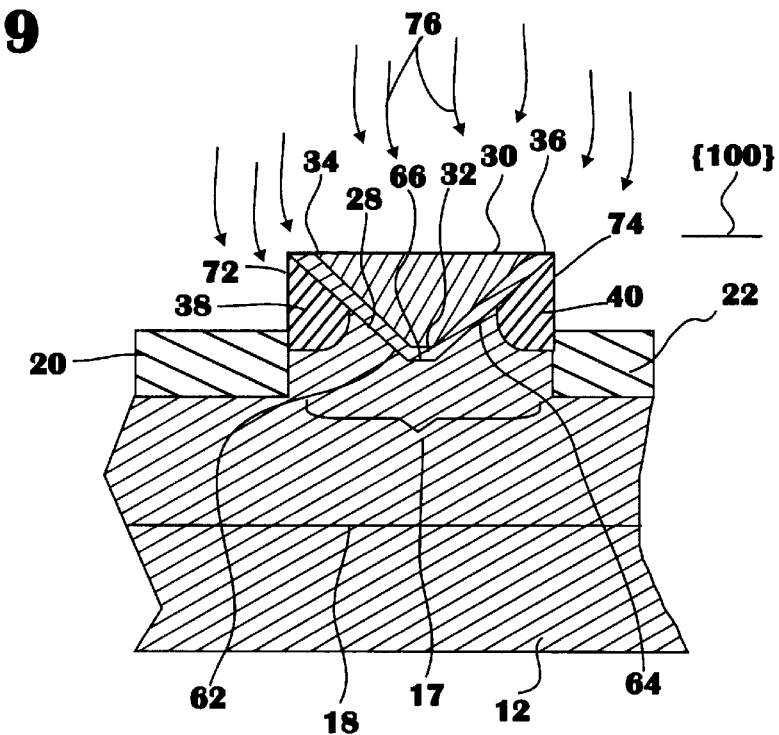
FIG. 9 is a cross-sectional view like FIG. 8 depicting removal of upper portions of the isolation structures and formation of source/drain regions in the substrate in accordance with the present invention.

The formation of the source/drain regions 38 and 40 may be understood by referring now to FIG. 9. Initially, a top portion of each of the isolation structures 20 and 22 is removed to expose sidewalls 72 and 74 of the active area 17. The removal is advantageously done via reactive ion etching, chemical plasma etching, or the like anisotropic etching techniques. The etch reduces the thickness of the structures 20 and 22 by approximately one third to one half, and accordingly establishes the top surfaces 75 of the isolation structures 20 and 22 at an elevation below the top surface of the active area as represented by the {100}-plane. Following removal of the upper portions of the isolation structures 20 and 22, the source/drain regions 38 and 40 are established in the substrate 12 by diffusing a n-type dopant specie as indicated by the arrows 76. The appropriate dopant specie will depend upon the device type, e.g. n-channel or p-channel and to a large degree on design discretion. In an exemplary embodiment, arsenic may be diffused in a furnace process for about 10 to 60 seconds at about 800 to 1150° C. The lateral diffusion of the arsenic establishes the junction boundaries of the source/drain regions 38 and 40 and thereby defines the channel region 42. The ultimate length of the channel 42 may vary depending upon subsequent heat steps which can cause additional dopant migration.

As the skilled artisan will appreciate, the transistors 14 and 16 include overlapping gate and source/drain features. However, as noted above, the process in accordance with the present invention establishes the gate dielectric layers 28 and 44 with a relatively thicker legs 34 and 36 and 48 and 50 that serve to reduce the impact of any overlap capacitances as well as punchthrough and tunneling effects while the relatively thinner portions at the apexes 32 and 46 provide a very thin gate dielectric layer in the channel regions 42 and 58, thereby reducing the requisite threshold voltages for the transistors 14 and 16 and enhancing the performance thereof. The V-shaped gate dielectric layers 28 and 44 enable the overall lateral dimensions of the transistor 14 and 16 to be shrunk and thus provide for much tighter packing density on the substrate 12.

Figure 10:
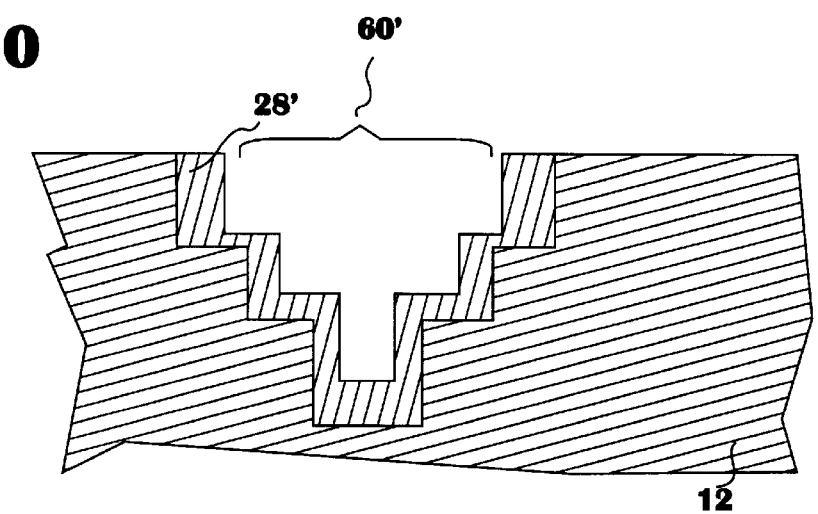
FIG. 10 is a cross-sectional view of a portion of a substrate showing one alternate embodiment of the gate dielectric layer with a V-shaped cross-section in accordance with the present invention.
Figure 11:
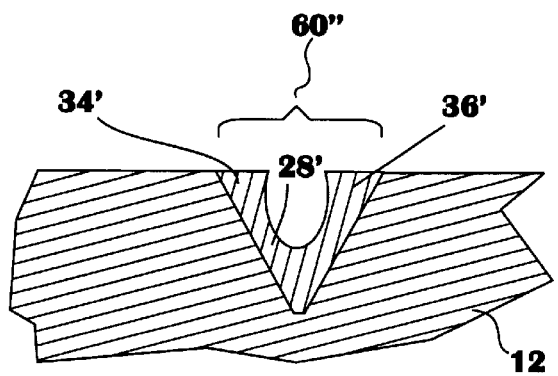
FIG. 11 is a cross-sectional view of a portion of a substrate showing another alternate embodiment of the gate dielectric layer with a V-shaped cross-section in accordance with the present invention.

As used herein, the term "V-shaped" is intended to encompass a variety of shapes having upwardly projecting sloped legs. For example, as shown in FIG. 10, the channel, now designated 60' and the gate dielectric layer now designated 28' may be fabricated with a stair-step cross section. Alternatively, and as shown in FIG. 11, the channel, now designated 60" and the gate dielectric layer now designated 28", may be fabricated with a dish-like cross section with upwardly projecting arcuate legs, now designated 34' and 36'. These two alternative cross-sectional shapes represent just two of the myriad of possible alternative V-shaped structures for the channel and the gate dielectric layer encompassed within the spirit and scope of the present invention.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A transistor, comprising:
    a substrate having an active area and a channel in the active area having a substantially flat bottom and upwardly sloping walls;
    a gate dielectric layer positioned in the channel and having a bottom portion having a first thickness, a first leg projecting obliquely upwardly from the bottom portion and having a second thickness, a second leg protecting obliquely upwardly from the bottom portion and having a third thickness, the second and third thicknesses being larger than the first thickness, the bottom portion and the first and second legs defining a V-shaped cross-section;

a gate electrode positioned on the gate dielectric layer;

a first source/drain region positioned in the substrate; and a second source/drain region positioned in the substrate in spaced-apart relation to the first source/drain region to define a channel region beneath the gate dielectric layer.

2. The transistor of claim 1, wherein the first and second legs are substantially straight.

3. The transistor of claim 1, wherein the first and second source/drain regions are positioned beneath the gate dielectric layer.

4. The transistor of claim 2, wherein the substrate has a horizontal plane, the first and second legs projecting upwardly at an angle of about 10° to 80° with respect to the horizontal plane.

5. The transistor of claim 1, comprising an electrical isolation structure surrounding the active area and having an upper surface positioned below the upper surface of the active area.

6. An integrated circuit, comprising;

a substrate having a plurality of active areas, each of the active areas having a channel with a substantially flat bottom and upwardly sloping walls; and a plurality of transistors positioned on the plurality of active areas, each of the transistors having a gate dielectric layer with a bottom portion having a first thickness, a first leg projecting obliquely upwardly from the bottom portion and having a second thickness, a second leg projecting obliquely upwardly from the bottom portion and having a third thickness, the second and third thicknesses being larger than the first thickness, the bottom portion and the first and second legs defining a V-shaped cross-section positioned in one of the plurality of channels, a gate electrode positioned on the gate dielectric layer, a first source/ drain region positioned in the substrate, and a second source/drain region positioned in the substrate in spaced-apart relation to the first source/drain region to define a channel region beneath the gate dielectric layer.

7. The integrated circuit of claim 6, wherein the first and second legs are substantially straight.

8. The integrated circuit of claim 6, wherein the first and second source/drain regions are positioned beneath the gate dielectric layer.

9. The integrated circuit of claim 7, wherein the substrate has a horizontal plane, the first and second legs projecting upwardly at an angle of about 10° to 80° with respect to the horizontal plane.

10. The integrated circuit of claim 7, comprising an electrical isolation structure surrounding the active area and having an upper surface positioned below the upper surface of the active area.

11. A transistor, comprising:

a substrate having an active area and a channel in the active area having a substantially flat bottom and upwardly sloping walls, a portion of the active area being positioned above an isolation structure such that opposite sidewalls of the active area are exposed;

a gate dielectric layer positioned in the channel and having a V-shaped cross-section;

a gate electrode positioned on the gate dielectric layer;

a first source/drain region positioned in the active area adjacent the one of the sidewalls; and a second source/drain region positioned in the active area adjacent to the other of the sidewalls and in spaced-apart relation to the first source/drain region to define a channel region beneath the gate dielectric layer.

12. The transistor of claim 11, wherein the gate dielectric layer comprises a bottom portion and first and second substantially straight legs projecting obliquely upwardly from the bottom portion.

13. The transistor of claim 12, wherein the bottom portion has a first thickness, the first leg has a second thickness and the second leg has a third thickness, the second and third thicknesses being larger than the first thickness.

* * * * *

UNITED STATES PATENT AND TRADEMARK OFFICE
CERTIFICATE OF CORRECTION

PATENT NO.   : 6,078,078
DATED        : June 20, 2000
INVENTOR(S)  : Mark I. Gardner, H. Jim Fulford and Charles E. May It is certified that error appears in the above-identified patent and that said Letters Patent is hereby corrected as shown below:

Column 2,
Line 6, delete "SiO" and substitute -- $SiO_2$ -- therefor;
Line 41, delete "protecting" and substitute -- projecting -- therefor;

Column 6,
Lines 52-53, delete "for the well implants and the anneal process will depend on;
Line 54, after the word "parameters" insert -- for the well implants and the anneal process will depend on --;
Lines 60-62, insert the word -- and -- between the words "control" and "punchthrough"; and insert the word -- prevention -- between the words "punchthrough" and "implants";

Column 7,
Line 31, delete "T" and substitute -- $T_1$ -- therefor;

Column 9,
Line 3, delete "protecting" and substitute -- projecting -- therefor; and Column 10,
Line 15, change the dependency thereof from claim 7 to claim 6.

Signed and Sealed this

Sixteenth Day of September, 2003

JAMES E. ROGAN
*Director of the United States Patent and Trademark Office*